(12) United States Patent
Uemura et al.

(10) Patent No.: US 7,304,325 B2
(45) Date of Patent: Dec. 4, 2007

(54) GROUP III NITRIDE COMPOUND SEMICONDUCTOR LIGHT-EMITTING DEVICE

(75) Inventors: Toshiya Uemura, Nishikasugai-gun (JP); Koichi Ota, Nishikasugai-gun (JP)

(73) Assignee: Toyoda Gosei Co., Ltd., Nishikasugai-gun, Aichi (JP)

( * ) Notice: Subject to any disclaimer, the term of this patent is extended or adjusted under 35 U.S.C. 154(b) by 18 days.

(21) Appl. No.: 09/845,336

(22) Filed: May 1, 2001

(65) Prior Publication Data
US 2001/0045562 A1 Nov. 29, 2001

(30) Foreign Application Priority Data
May 1, 2000 (JP) .......................... P. 2000-131933
May 25, 2000 (JP) .......................... P. 2000-154184

(51) Int. Cl.
*H01L 21/00* (2006.01)
(52) U.S. Cl. .............................. 257/79; 257/72; 257/69
(58) Field of Classification Search .................. 257/11, 257/14, 15, 79, 189, 201, 615, 622, 190, 257/103, 99, 76, 96, 97, 200, 72, 69; 372/46, 372/45
See application file for complete search history.

(56) References Cited

U.S. PATENT DOCUMENTS

| | | | |
|---|---|---|---|
| 5,753,940 A * | 5/1998 | Komoto ........................ | 257/95 |
| 5,767,581 A | 6/1998 | Nakamura et al. ........... | 257/749 |
| 5,814,533 A * | 9/1998 | Shakuda ........................ | 438/46 |
| 5,838,029 A * | 11/1998 | Shakuda ........................ | 257/190 |
| 5,974,069 A * | 10/1999 | Tanaka et al. ................ | 372/46 |
| 5,998,925 A | 12/1999 | Shimizu et al. .............. | 313/503 |
| 6,023,076 A * | 2/2000 | Shibata ........................ | 257/94 |
| 6,087,681 A * | 7/2000 | Shakuda ........................ | 257/103 |
| 6,111,277 A * | 8/2000 | Ikeda ........................... | 257/99 |
| 6,274,891 B1 * | 8/2001 | Tanaka et al. ................ | 257/99 |
| 6,288,416 B1 * | 9/2001 | Koike et al. .................. | 257/94 |
| 6,298,079 B1 * | 10/2001 | Tanaka et al. ................ | 372/46 |
| 6,531,719 B2 * | 3/2003 | Shibata et al. ............... | 257/190 |
| 6,623,998 B2 * | 9/2003 | Shibata et al. ............... | 438/22 |
| 6,917,059 B2 * | 7/2005 | Uemura ........................ | 257/103 |
| 2001/0045562 A1 * | 11/2001 | Uemura et al. ............... | 257/79 |
| 2001/0050376 A1 * | 12/2001 | Shibata et al. ............... | 257/190 |

(Continued)

FOREIGN PATENT DOCUMENTS

JP          11-273571          10/1999

(Continued)

OTHER PUBLICATIONS

Computer Generated English translation of Ishikawa's JP 11-330565A.*

(Continued)

*Primary Examiner*—Laura M. Schillinger
(74) *Attorney, Agent, or Firm*—McGinn IP Law Group, PLLC

(57) ABSTRACT

A semiconductor laminate containing a light-emitting layer is etched to reveal a side surface. A reflection surface opposite to the side surface of the semiconductor laminate is provided in one and the same chip as the semiconductor laminate. A groove may be formed in the laminate by a dicing saw, and an outer side surface of the groove may be provided as the reflection surface.

24 Claims, 5 Drawing Sheets

U.S. PATENT DOCUMENTS

2002/0030201 A1* 3/2002 Uemura ..................... 257/189
2004/0129948 A1* 7/2004 Uemura ..................... 257/103
2005/0205890 A1* 9/2005 Uemura ..................... 257/103

FOREIGN PATENT DOCUMENTS

JP 11330565 A * 11/1999
JP 2001-024222 1/2001

OTHER PUBLICATIONS

Computer Generated English translation of Ishikawa's JP 11-330565A, 2006.*

* cited by examiner

GROUP III NITRIDE COMPOUND SEMICONDUCTOR LIGHT-EMITTING DEVICE

BACKGROUND OF THE INVENTION

1. Field of the Invention

The present invention relates to a group III nitride compound semiconductor light-emitting device.

The present application is based on Japanese Patent Applications No. 2000-131933 and 2000-154, which are incorporated herein by reference.

2. Description of the Related Art

As described in Unexamined Japanese Patent Publication No. Hei. 11-273571, a light-emitting device is mounted in a cup portion of a mount lead. Electrically conductive wires are connected to the light-emitting device. The light-emitting device is further sealed with a round-type sealing member made of a light-transmissible resin. A light-emitting system configured thus has an optical axis in a direction of the center axis (normal line) of the light-emitting device chip, so that light emitted from the light-emitting device is concentrated in the direction of the optical axis by a forward end half-spherical portion (convex lens portion) of the round-type sealing member. It is, however, impossible to control light coming off the forward end half-spherical portion. Therefore, in order to effectively utilize the light in the direction (in the direction departing from the direction of the center axis), a circumferential wall of the cup portion is provided as a parabolic type wall so that the transverse light is reflected in the direction of the optical axis by the circumferential wall.

A group III nitride compound semiconductor light-emitting device exhibiting emission of light in a range of from blue to green radiates a large quantity of light transversely, in comparison with a red type light-emitting device. In such a group III nitride compound semiconductor light-emitting device large in the quantity of transversely radiated light, how to utilize the transverse light is an importance problem in improvement in light-emitting efficiency of the light-emitting system.

If the reflection surface of the circumferential wall of the background-art cup portion is viewed from this respect, a clearance of from 200 to 300 μm serving as a space for letting a chip-holding jig escape was required to be placed between the chip and the circumferential wall of the cup portion in ordinary design. On the other hand, the thickness of the semiconductor layer in the chip was several μm and the height of the cup portion was limited upon the design of the light-emitting system. Hence, the reflection surface of the circumferential wall of the cup portion could reflect only the transversely radiated light within an angle of elevation of about 10 degrees from a direction perpendicular to the center axis (a right transverse direction).

SUMMARY OF THE INVENTION

An object of the present invention is to provide a light-emitting device in which light emitted from a side surface of a semiconductor layer can be utilized effectively. Therefore, the present invention proposes a group III nitride compound semiconductor light-emitting device configured as follows.

That is, a group III nitride compound semiconductor light-emitting device comprises: a semiconductor laminate portion including a light-emitting layer; and a reflection surface disposed so as to be opposite to a side surface of the semiconductor laminate portion formed by etching, wherein the semiconductor laminate portion and the reflection surface are provided in one chip.

According to the group III nitride compound semiconductor light-emitting device configured as described above, the distance between the reflection layer and the semiconductor laminate portion can be made as narrow as possible because the reflection layer and the semiconductor laminate portion are formed in one chip. Hence, a larger part of light transversely emitted from the semiconductor laminate portion can be grasped by the reflection layer so as to be reflected in the direction of the center axis (optical axis). Hence, light-utilizing efficiency is improved. Hence, the light-emitting device can be obtained as a light-emitting device achieving a high-level luminance with a small amount of electric power.

Because an electrically insulating sapphire substrate is used for the group III nitride compound semiconductor light-emitting device, the p-type semiconductor layer, the light-emitting layer and the n-type semiconductor layer are partially removed by etching in order to form an electrode. If the etching step is used, the semiconductor laminate portion inclusive of the light-emitting layer can be formed without addition of any special step. In this case, a side surface (surface of elevation) of the semiconductor laminate portion is formed by the etching step. Hence, an optional shape (width) of the n-type semiconductor layer can be revealed by the etching step. Hence, if a reflection surface is formed on the exposed portion by selecting a suitable method, the reflection surface can be formed as close to the side surface of the semiconductor laminate portion as possible. When, for example, the reflection surface is made of the same material as that of an n pad electrode, no special step needs to be provided additionally because the reflection surface can be formed at the same time when the n pad electrode is formed by vapor deposition.

That is, the light-emitting device according to the present invention can be produced by means of suitably changing masks used in the etching step and the step for forming the n pad electrode without any substantial change of the background-art steps. That is, a high-output light-emitting device can be provided inexpensively.

Further, from another point of view, there is provided another group III nitride compound semiconductor light-emitting device comprising:

a laminate of group III nitride compound semiconductor layers inclusive of a light-emitting layer;

a groove formed in the laminate mechanically; and a reflection surface formed on an outer side surface of the groove.

According to the group III nitride compound semiconductor light-emitting device configured thus, the reflection surface is formed on an outer side surface of the groove formed mechanically. Hence, light emitted from the light-emitting layer through an inner side surface of the groove is reflected by the reflection surface. The width of the mechanically formed groove is defined by the thickness of a cutting blade. The thickness of the cutting blade is smaller by one order than the distance (200 to 300 μm) between the light-emitting device and the reflection surface in the background art. That is, the width of the groove can be set to be in a range of from 20 to 30 μm. As a result, a larger part of the light emitted from the inner side surface of the groove formed in the laminate (light transversely emitted from the light-emitting device) can be grasped by the reflection layer and reflected in a desired direction. Hence, light-utilizing efficiency is improved. Hence, alight-emitting device achieving a high-level luminance with a small amount of electric power can be obtained.

The wafer is cut into light-emitting device chips by a known method. From a point of view of simplification of the production process and apparatus and reduction in production cost of the device, it is preferable that the groove is formed by a mechanical cutting apparatus (dicing saw) used on this occasion.

If the groove is formed on the same condition as the condition for forming cutting lines for cutting the wafer into the light-emitting device chips, greater reduction of the production cost can be attained. It is therefore preferable that the groove is formed so as to be parallel to the cutting line and as deep as the cutting line. As a result, the groove has a depth reaching a substrate. Further, the groove is preferably formed rectangularly so as to surround the laminate (effective light-emitting portion) of group III nitride compound semiconductor layers.

The cross-sectional shape of the groove formed by the dicing saw is semicircular as shown in FIG. 6B. Hence, the side surface 123 of the groove 121 located in the outside viewing from the center of the chip is shaped like a curved taper. Among the light emitted by the laminate 18 of group III nitride compound semiconductor layers, transverse light is released from the inner side surface 124 of the groove 121 and reflected by the reflection surface 127 formed on the outer side surface 123. Because the outer side surface 123 is shaped like a taper, the light transversely released from the laminate 18 is reflected in a direction of the optical axis (normal line or center axis) of the light-emitting device 100 by the reflection surface formed along the outer side surface 123.

Features and advantages of the invention will be evident from the following detailed description of the preferred embodiments described in conjunction with the attached drawings.

DETAILED DESCRIPTION OF THE PREFERRED EMBODIMENTS

Figure 1:
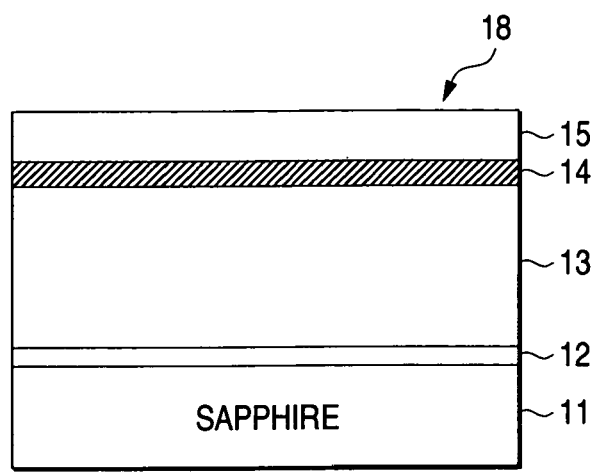
FIG. 1 is a sectional view showing the configuration of group III nitride compound semiconductor layers in a light-emitting device according to an embodiment of the present invention.

The detailed description of the present invention will be described below with reference to the drawings.

The semiconductor laminate portion is made of a laminate of a plurality of group III nitride compound semiconductor layers inclusive of a light-emitting layer. In this specification, a group III nitride compound semiconductor is represented by the general formula: $Al_XGa_YIn_{1-X-Y}N$ ($0 \leq X \leq 1$, $0 \leq Y \leq 1$, $0 \leq X+Y \leq 1$) which includes so-called binary compounds such as AlN, GaN and InN, and so-called ternary compounds such as $Al_XGa_{1-X}N$, $Al_XIn_{1-X}N$ and $Ga_XIn_{1-X}N$ (in the above cases; $0<X<1$). The group III elements may be partially replaced by boron (B), thallium (Tl), or the like. The nitrogen (N) may be partially replaced by phosphorus (P), arsenic (As), antimony (Sb), bismuth (Bi), or the like. The group III nitride compound semiconductor layer may contain an optional dopant. Si, Ge, Se, Te, C, or the like, can be used as n-type impurities. Mg, Zn, Be, Ca, Sr, Ba, or the like, can be used as p-type impurities. Incidentally, the group III nitride compound semiconductor doped with p-type impurities may be irradiated with electron beams or with plasma or heated in a furnace. The method of forming the group III nitride compound semiconductor layer is not specifically limited. For example, the group III nitride compound semiconductor layer can be formed by a metal organic chemical vapor deposition method (MOCVD method) or formed by a known method such as a molecular beam epitaxy method (MBE method), a halide vapor phase epitaxy method (HVPE method), a sputtering method, anion-plating method, an electron showering method, etc.

Incidentally, a homo, hetero or double hetero structure provided with an MIS, PIN or p-n junction may be used as the configuration of the light-emitting device (in these cases, the layer contributing to light emission is referred to as light-emitting layer). A quantum well structure (single quantum well structure or multiple quantum well structure) may be used as the light-emitting layer.

The laminate of the plurality of group III nitride compound semiconductor layers is etched to reveal the n pad electrode-forming surface. In order to form a side surface (surface of elevation), the whole circumference of the chip is etched continuously or discontinuously by use of the etching step. Alternatively, the etching step for forming the side surface may be provided separately from the etching step for forming the n pad electrode-forming surface. When the two steps are provided as separate steps, the depth (first depth) of etching for forming the side surface is preferably set to be deeper than the depth (second depth) of etching for forming the n pad electrode. Hence, light emitted downward from the side surface can be also grasped by the reflection surface because the lower edge of the reflection surface is disposed below the semiconductor laminate portion. If the depth of etching is too shallow, the downward component of light emitted from the side surface of the semiconductor laminate portion enters the semiconductor layer (n-type semiconductor layer). This semiconductor layer has an amount of band gap energy corresponding to the wavelength of emitted light because this semiconductor layer is also made of a group III nitride compound semiconductor. Hence, a large part of the entrance light is absorbed to the semiconductor material. It is, therefore, preferable that the light emitted from the side surface of the semiconductor laminate portion is made incident as much as possible directly onto the reflection layer so as to be reflected by the reflection surface in the direction of the optical axis.

The aforementioned etching step is performed by dry etching using a gas such as argon, chlorine, or the like.

The light-transmissible metal electrode formed on the p-type semiconductor is preferably formed on the whole region of the p-type semiconductor. In the group III nitride compound semiconductor, because the electric resistance of the p-type semiconductor layer is generally high, a current is evenly injected into the light-emitting layer so as to obtain sufficient light emission. Because the light-transmissible electrode is formed up to the edge portion of the p-type contact layer, the effective light-emitting portion reaches the side surface of the semiconductor laminate portion. As a result, intensive light is emitted from the side surface.

For example, an alloy containing cobalt and gold can be used as the light-transmissible electrode. In the alloy, the cobalt may be partially replaced by at least one element selected from the group consisting of nickel (Ni), iron (Fe), copper (Cu), chromium (Cr), tantalum (Ta), vanadium (V), manganese (Mn), aluminum (Al) and silver (Ag) and the gold may be partially replaced by at least one element selected from the group consisting of palladium (Pd), iridium (Ir) and platinum (Pt).

The light-transmissible electrode contains cobalt laminated as a first electrode layer having a film thickness of from 0.5 to 15 nm on the p-type contact layer, and gold laminated as a second electrode layer having a film thickness of from 3.5 to 25 nm on the cobalt layer. Then, the two layers are alloyed by a heating step. After the heating step, the element distribution in a direction of the depth from the surface of the p-type contact layer is formed to be a distribution in which Au permeates the p-type contact layer more deeply than Co.

The heating step is preferably performed in a gas containing oxygen. On this occasion, at least one member gas or a mixture gas selected from the group consisting of $O_2$, $O_3$, CO, $CO_2$, NO, $N_2O$, $NO_2$ and $H_2O$ can be used as the oxygen-containing gas. Alternatively, a mixture gas of an inert gas with at least one member gas selected from the group consisting of $O_2$, $O_3$, CO, $CO_2$, NO, $N_2O$, $NO_2$ and $H_2O$ may be used as the oxygen-containing gas. Alternatively, a mixture gas of an inert gas with a mixture gas selected from the group consisting of $O_2$, $O_3$, CO, $CO_2$, NO, $N_2O$, $NO_2$ and $H_2O$ may be used as the oxygen-containing gas. In brief, the oxygen-containing gas means a molecular gas containing oxygen atoms.

Any atmospheric pressure may be used in the heating step so long as the atmospheric pressure is not lower than the pressure at which the gallium nitride compound semiconductor is not thermally decomposed. When only an $O_2$ gas is used as the oxygen-containing gas, the oxygen-containing gas may be preferably imported while the pressure of the oxygen-containing gas is set to be not lower than the pressure of decomposition of the gallium nitride compound semiconductor. When a mixture gas of $O_2$ with another inert gas is used as the oxygen-containing gas, the total pressure of the oxygen-containing gas is set to be not lower than the pressure of decomposition of the gallium nitride compound semiconductor and the partial pressure of the $O_2$ gas is set to be not lower than about $10^{-6}$ as high as the total pressure of the oxygen-containing gas. In brief, so long as there is provided a very small amount of oxygen-containing gas, the heating step can be performed well. Incidentally, the upper limit of the amount of the oxygen-containing gas to be imported is not specifically limited by characteristic of a reduction of contact resistance between p-type layer and p electrode. In short, any amount of the oxygen-containing gas may be used so long as the electrode can be produced.

The temperature used in the heating step is most preferably in a range of from 400 to 600° C. A low contact resistance between p-type gallium nitride layer and p electrode with an entirely saturated resistivity can be obtained at a temperature not lower than 400° C. The preferred temperature range is from 450 to 650° C.

The present invention is applied also to the case where the electrode formed on the p-type semiconductor is not light-transmissible. When the electric resistance of the p-type semiconductor is reduced so that the electrode is formed spotwise on the p-type semiconductor, the whole p-n junction surface serves as a light-emitting region in the same manner as the background-art GaAs, or the like. Also in this case, a large quantity of light is emitted from the side surface.

The reflection layer is preferably disposed near the side surface so that the light emitted from the side surface of the semiconductor laminate portion can be reflected as much as possible. The film thickness of the reflection layer is preferably set to be large. According to the inventor's examination, the distance between the reflection layer and the side surface is preferably in a range of from 0.1 to 10 μm. If the distance is smaller than 0.1 μm, there is fear that the a reflection layer may come into contact with the side surface and block the side surface in accordance with accuracy in the production process. If the distance is larger than 10 μm, the area of the etching region ineffectively acting as a light-emitting device is enlarged unnecessarily. The distance between the reflection layer and the side surface of the semiconductor laminate portion is set to be more preferably in a range of from 0.2 to 7 μm, further preferably in a range of from 0.3 to 5 μm, most preferably in a range of from 0.5 to 4 μm. The film thickness of the reflection layer is preferably in a range of from 0.5 to 30 μm. If the thickness is smaller than 0.5 μm, light emitted from the side surface cannot be reflected effectively. If the thickness is larger than 30 μm, a long time is required for producing the reflection layer and there is the possibility that the reflection surface may be squashed in the post-step. The film thickness of the reflection layer is set to be more preferably in a range of from 0.7 to 15 μm, further preferably in a range of from 1.0 to 10 μm, most preferably in a range of from 1.5 to 5 μm.

In order to attain effective utilization of light emitted from the side surface of the semiconductor laminate portion, the reflection surface preferably reflects the light in the direction of the optical axis (in the direction of the center axis of the chip). It is a matter of course that the direction of reflection is not necessarily limited thereto so long as the required optical characteristic is satisfied.

The method of forming the reflection surface is not specifically limited if the reflection surface is formed opposite to the side surface of the semiconductor laminate portion and to be a substantially mirror surface. If a reflection member having a reflection surface is formed by vapor deposition when the n pad electrode is formed by vapor deposition, a substantial mirror surface can be obtained without unnecessarily increasing the number of steps.

If attention is paid to the n pad electrode formed of the same material as that of the reflection surface and simultaneously to the reflection surface, the n pad electrode has a surface opposite to the side surface of the semiconductor laminate portion. Therefore, the surface opposite to the semiconductor laminate portion in the n pad electrode is preferably formed as a reflection surface (second reflection surface) so that light emitted from the side surface is reflected by the reflection surface and utilized effectively. The distance between the semiconductor laminate portion and the reflection surface of the n pad electrode is preferably set to be in a range of from 0.1 to 10 μm. The lower limit in the aforementioned range is defined for the purpose of preventing a short circuit from being generated between the light-transmissible electrode or p-type semiconductor layer and the n pad electrode. The upper limit in the aforementioned range is defined for the purpose of suppressing unnecessary increase of the region which does not contribute to light emission. The distance between the semiconductor laminate portion and the n pad electrode is set to be more preferably in a range of from 0.2 to 7 μm, further preferably in a range of from 0.3 to 5 μm, most preferably in a range of from 0.5 to 4 μm.

The reflection surface according to the present invention can reflect a larger part of transverse light in comparison with the reflection surface of the circumferential wall of the cup portion. Hence, the light-emitting system in which the light-emitting device according to the present invention is mounted can increase luminous intensity by about 10% with the same amount of input electric power, in comparison with the background-art system.

If the light-emitting device according to the present invention is used, there is some case where the reflection surface of the circumferential wall of the cup portion need not be provided. In this case, it is unnecessary to form the cup portion in the mount lead. Hence, the configuration of the mount lead can be simplified, so that the mount lead can be produced inexpensively. Accordingly, the cost for production of the light-emitting system itself can be reduced.

The light-emitting device according to the present invention is particularly effective in an SMD type LED (of the type in which a chip is directly mounted on a printed substrate) because the reflection layer is built in the light-emitting device.

An embodiment of the present invention will be described below.

This embodiment shows a light-emitting diode. FIG. 1 shows the configuration of group III nitride compound semiconductor layers in the light-emitting diode. An n-type layer 13, a multiple layer 14 including a layer for light emission and a p-type layer 15 (inclusive of a buffer layer 12 as occasion demands) form a laminate 18 of group III nitride compound semiconductor layers.

| Layer | Composition | Dopant | (Film Thickness) |
|---|---|---|---|
| Light-transmissible electrode 16 | Au (6 nm)/ Co (1.5 nm) | | |
| p-type layer 15 | p-AlGaN | Mg | (0.1 μm) |
| Multiple layer 14 | Superlattice structure | | |
| Quantum well layer | In$_{0.15}$Ga$_{0.85}$N | | (2.0 nm) |
| Barrier layer | GaN | | (15 nm) |
| The number of repeated time of quantum well and barrier Layers: 1 to 10 | | | |
| n-type layer 13 | n-GaN | Si | (4 μm) |
| AlN buffer layer 12 | AlN | | (60 nm) |
| Substrate 11 | Sapphire (surface a) | | (300 μm) |

The n-type layer 13 may be of a double-layered structure having an n⁻ layer of low electron density on the multiple layer 14 side and an n⁺ layer of high electron density on the buffer layer 12 side. The latter is called n-type contact layer.

The multiple layer 14 is not limited to the superlattice structure. A single hetero type structure, a double hetero type structure, a homo junction type structure, or the like, may be used as the configuration of the light-emitting device.

A group III nitride compound semiconductor layer doped with an acceptor such as magnesium and having a wide band gap may be interposed between the multiple layer 14 and the p-type layer 115. This technique is provided for preventing electrons, which are imported into the multiple layer 14, from dispersing into the p-type layer 15.

The p-type layer 15 may be of a double-layered structure having a p⁻ layer of low hole density on the multiple layer 14 side and a p⁺ layer of high hole density on the electrode side. The latter is called p-type contact layer.

In the light-emitting diode configured as described above, each of the group III nitride compound semiconductor layers is formed by execution of MOCVD on a general condition.

Figure 2A:
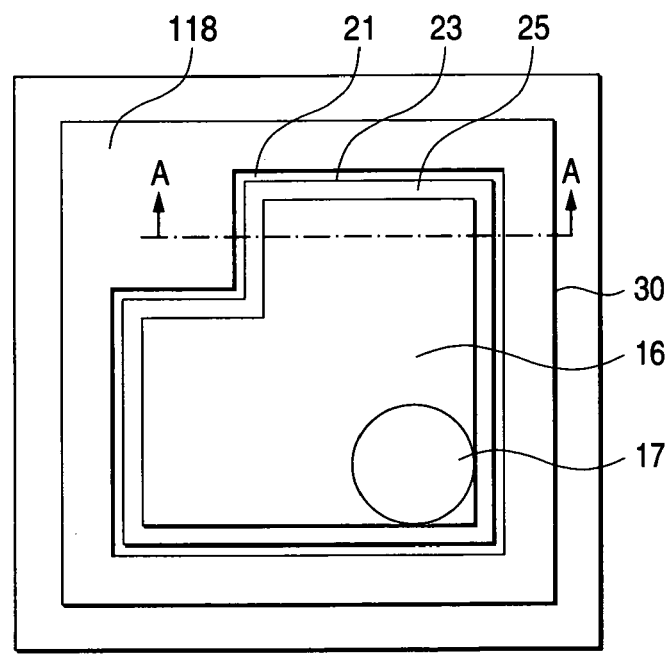
FIG. 2A is a plan view showing the light-emitting device according to the embodiment.
Figure 2B:
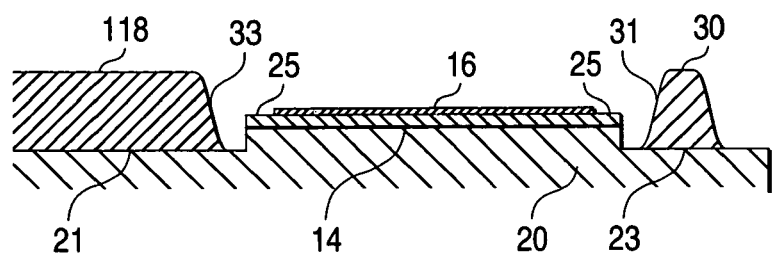
FIG. 2B is a sectional view taken along the line A-A in FIG. 2A.

Then, a mask is formed and the p-type layer 15, the light-emitting layer (active layer) 14 and the n-type layer 13 are partially removed by reactive ion etching to thereby reveal an n pad electrode-forming surface 21 on which an n pad electrode 118 will be formed (see FIGS. 2A, 2B). The whole circumference of the light-emitting surface facing the direction of the optical axis is etched to form a reflection-member-forming surface 23 simultaneously to the formation of the n pad electrode-forming surface 21. The semiconductor laminate portion 20 is defined by the etching.

A Co (cobalt) layer (1.5 nm) and an Au (gold) layer (6 nm) are successively laminated onto the whole surface of a wafer by a vapor deposition apparatus. Then, a photo resist is applied thereon uniformly and the photo resist is partially removed by an about 10 μm-wide portion (clearance region 25) from the n pad electrode-forming surface 21 and its periphery by photolithography. A part of the light-transmissible electrode-forming material corresponding to the portion is removed by etching to thereby reveal the semiconductor layer. Then, the photo resist is removed. A region of from the clearance region 25 to the circumferential edge portion of the n pad electrode-forming surface 21 may be coated with an electrically insulating and light-transmissible protective film (such as silicon oxide, silicon nitride, titanium oxide, aluminum oxide, or the like). A sputtering method or a CVD method can be used as the method for forming the protective film.

Then, a Cr (chromium) layer (30 nm), an Au layer (1.5 μm) and an Al (aluminum) layer (10 nm) are successively evaporated and laminated by a lift-off method to thereby form a p pad electrode 17.

Figure 3:
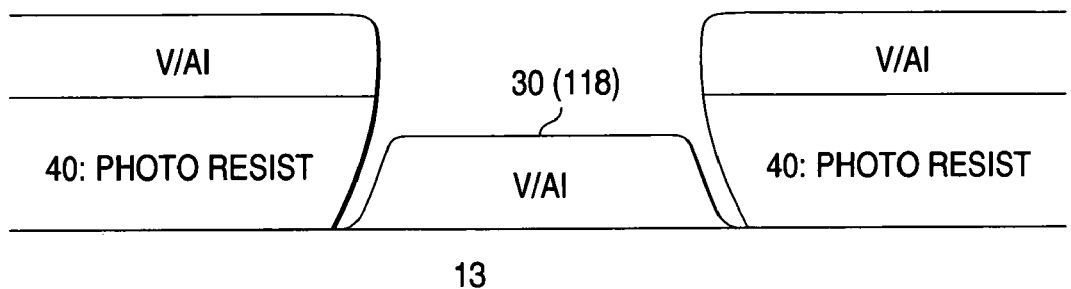
FIG. 3 is a sectional view showing a method of forming a reflection member.

The n pad electrode 118 made of V and Al is also formed by a lift-off method. When a V/Al alloy is evaporated, a wafer plane is rotated while the wafer plane is inclined with respect to an evaporating source (material source). (When a sputtering method is used, a wafer plane is rotated while the wafer plane is inclined with respect to a sputtering source.) As a result, in the opening portion of the photo resist 40, the circumferential surface of the V/Al alloy is tapered as shown in FIG. 3. The tapered side surface of the V/Al alloy is provided as a reflection layer 31 of the reflection member 30 and as a second reflection surface 33 of the n pad electrode 118. When the angle of inclination of the wafer plane with respect to the evaporating source is changed (little by little during vapor deposition as occasion demands), the inclination of the taper can be adjusted at option. As a result, the angle of reflection of light by the reflection surface can be controlled. In this embodiment, a vapor deposition apparatus having a planetary type wafer substrate holder is used.

The wafer obtained as described above is put into a heating furnace. The inside of the furnace is evacuated to be not higher than 1 Pa. Then, 02 is imported into the furnace until the degree of vacuum reaches ten-odd Pa. On this condition, the temperature of the furnace is set to 550° C. and heating is performed for about 4 minutes. Thus, the light-transmissible electrode 16 and the p pad electrode 17 are alloyed, the n pad electrode 118 of V and Al is alloyed and these alloys come into ohmic contact with the p-type and n-type semiconductors.

Then, the wafer is cut into chips by an ordinary method.

Figure 4A:
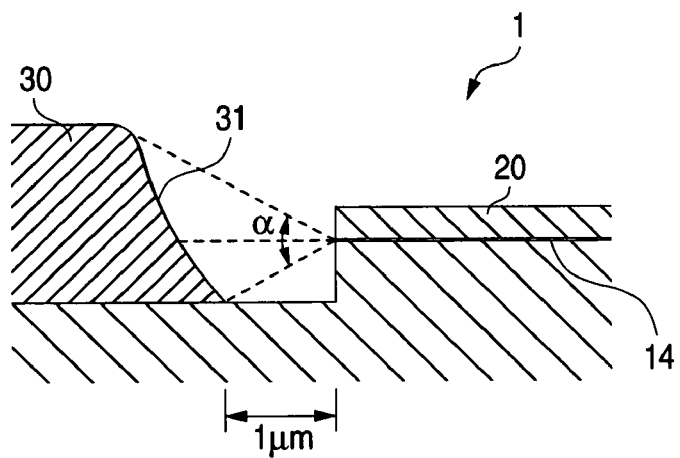
FIG. 4A shows the relation between the semiconductor laminate portion and the reflection surface in the light-emitting device according to the embodiment of the present invention.

In the light-emitting device 1 according to the embodiment configured as described above, the reflection surface 31 is disposed near and opposite to the side surface of the semiconductor laminate portion 20 as shown in FIG. 4A. Hence, a light component within an angle α among the light transversely emitted from the multiple layer 14 can be grasped by the reflection surface 31 and reflected in a desired direction.

Figure 4B:
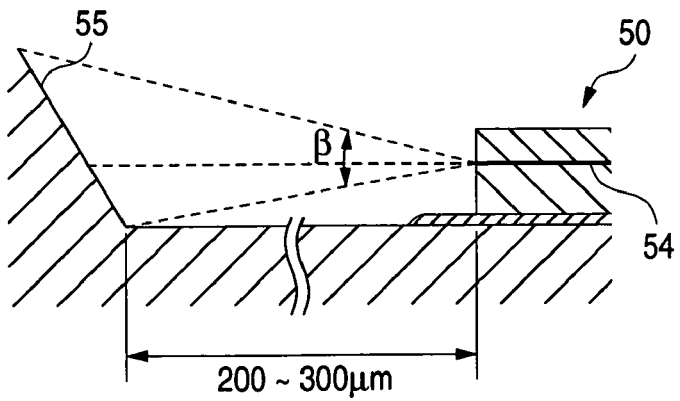
FIG. 4B shows the relation between a background-art light-emitting device and a circumferential wall of a cup portion.

On the contrary, such a reflection surface is not provided in the background-art light-emitting device 50 as shown in FIG. 4B. Hence, in the background art, light transversely emitted from a light-emitting layer 54 including a layer for light emission is reflected by the circumferential wall 55 of the cup portion. However, a large distance is between the light-emitting device 51 and the circumferential wall 55. Hence, in the background art, the light component reflected by the circumferential wall 55 of the cup portion among the transversely emitted light is a light component within a very small angle β ($\ll \alpha$).

Figure 5A:
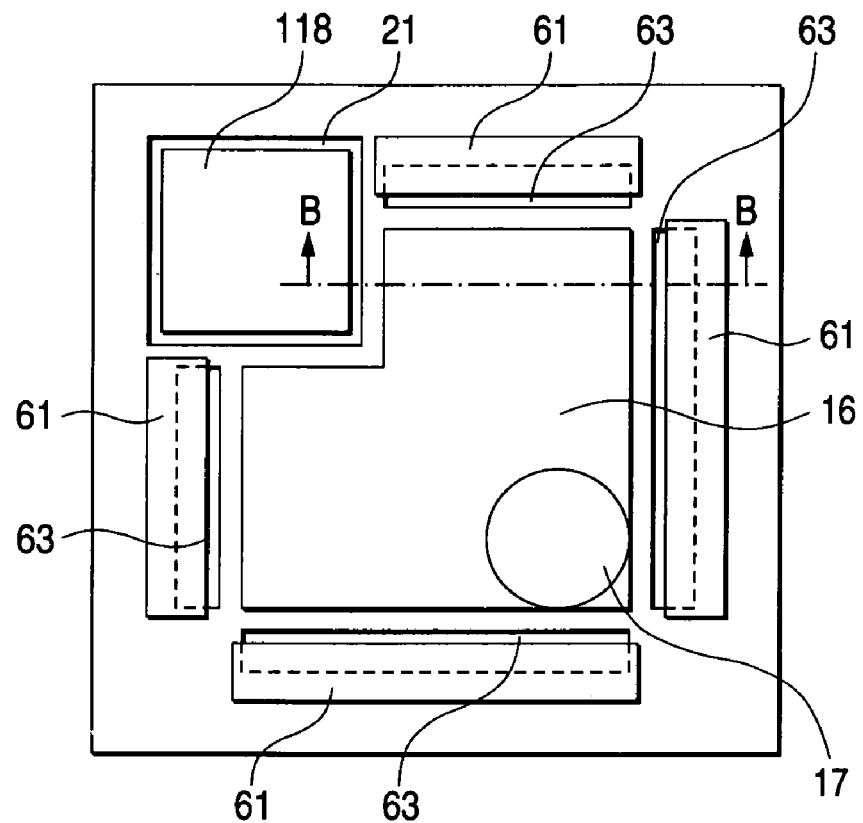
FIG. 5A is a plan view showing a light-emitting device according to another embodiment of the present invention.
Figure 5B:
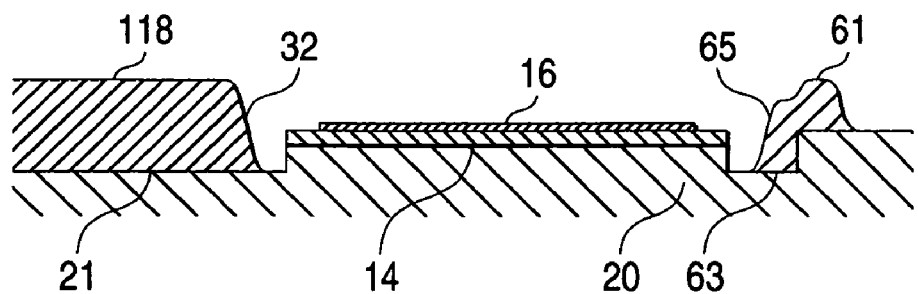
FIG. 5B is a sectional view taken along the line B-B in FIG. 5A.
Figure 6A:
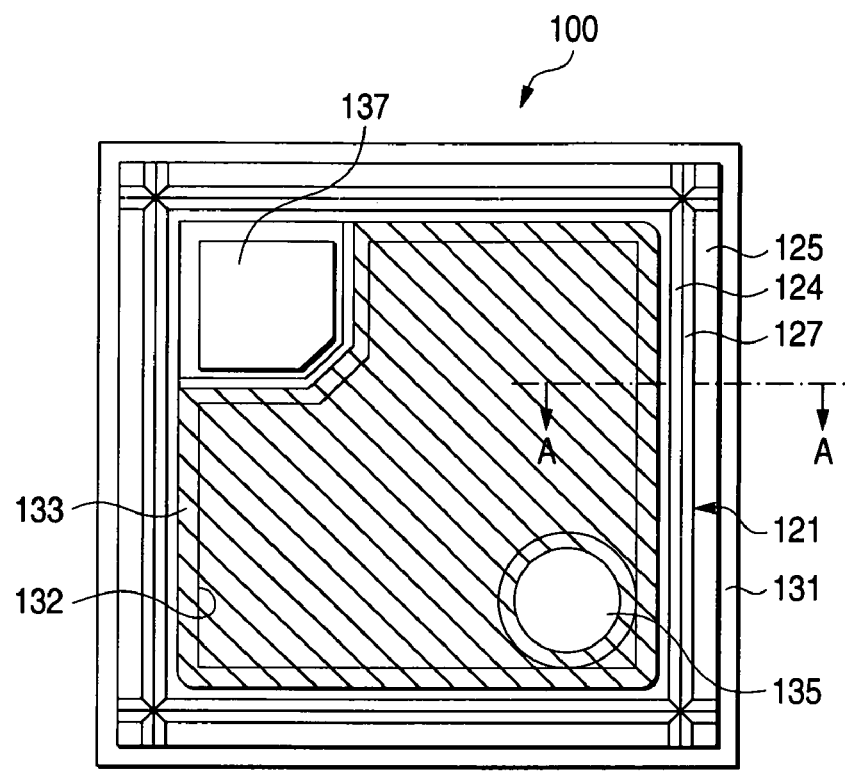
FIG. 6A is a plan view showing the light-emitting device according to still another embodiment.
Figure 6B:
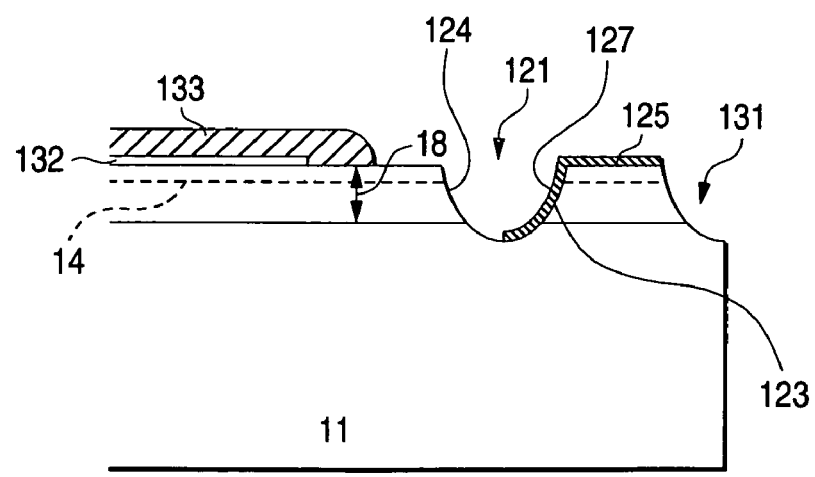
FIG. 6B is a sectional view taken along the line A-A in FIG. 6A.

FIGS. 5A and 5B show a light-emitting device 60 according to another embodiment. Elements the same as those in the light-emitting device in the above-mentioned embodiment are referenced correspondingly so that the duplication of description about the same elements are omitted here.

In this embodiment, the light-emitting device 60 has reflection members 61 separated from the n pad electrode 118. Grooves 63 are formed by etching in order to reveal side surfaces of the semiconductor laminate portion 20. The grooves 63 are preferably formed by the same step as the n pad electrode-forming surface 21. A side surface of each of the reflection members 61 opposite to the corresponding side surface of the semiconductor laminate portion 20 is formed as a reflection surface 65. Incidentally, the reflection member 61 partially runs onto the p-type semiconductor layer, so that the reflection member 61 is formed to be higher than the reflection member in the previous embodiment. Hence, a larger part of light emitted from the side surfaces of the semiconductor laminate portion 20 can be reflected by the reflection surface 65.

The reflection member 61 is formed by a lift-off method in the same manner as the reflection member 30 in the previous embodiment by use of the same step and material as those in the n pad electrode 118. The reflection member 61 obtained thus has electrically conductive characteristic, so that the n-type semiconductor layer under the reflection member 61 has the same potential as that of the reflection member 61. That is, the respective sides of the effective light-emitting region defined by the light-transmissible electrode 16 in this embodiment are equalized in potential on the n-type semiconductor layer side so long as the reflection member 61 is formed. Hence, uniformity of current density imported into the multiple layer 14 is attained, so that highly uniform light emission can be achieved in comparison with the light-emitting device having no electrically conductive reflection member (n-type auxiliary electrode).

From the point of another view, a groove may be formed in the laminate of group III nitride compound semiconductor layers by a mechanical method. The mechanical method used herein means a method of cutting a part of the laminate by a cutting blade. From a point of view of simplification of the production apparatus, it is preferable that the cutting blade (a dicing saw, or the like) used for cutting the wafer into light-emitting devices is used.

Hence, the shape of the groove is defined by the edge shape of the cutting blade. Alternatively, the cutting blade used for forming the groove may be provided differently from the cutting blade used for forming the cutting line in the wafer so as to cut the wafer into light-emitting devices. In this case, the sectional shape of the groove can be designed at option.

The width of the groove is preferably set to be as narrow as possible in order to bring the reflection surface closer to the side surface (inner side surface of the groove) of the laminate to grasp a larger part of light released from the side surface and reflect the larger part of light in a desired direction. According to the inventors' examination, the width in the opening portion of the groove is preferably set to be in a range of from 3 to 50 μm. If the width is smaller than 3 μm, the cutting blade for forming the groove is hardly kept sufficiently durable. If the width of the groove is larger than 50 μm, the area of the region not directly contributing to light emission is widened unnecessarily and undesirably.

The width of the opening portion of the groove is set to be more preferably in a range of from 5 to 45 μm, further preferably in a range of from 7 to 40 μm, still further preferably in a range of from 8 to 35 μm, most preferably in a range of from 10 to 30 μm.

In order to release light transversely from the laminate, it is necessary to form the groove to a depth sufficient to reveal the light-emitting layer in the laminate. The depth is, however, limited to a depth which can prevent the groove securely from cracking because of stress load in the separating step. It is preferable that the depth is as large as possible in this range. When the groove is formed deeply, light released downward from the side surface of the laminate (the inner side surface of the groove) can be also grasped by the reflection surface because the lower edge of the reflection surface is disposed more downward. If the depth of the groove is too small, the downward component of the light released from the side surface of the laminate enters the semiconductor layers. Because each of the semiconductor layers is made of a group III nitride compound semiconductor, the semiconductor layer has band gap energy in a region near to the wavelength of emitted light. Hence, a large part of entrance light is absorbed by the semiconductor material. It is therefore preferable that the light released from the side surface of the laminate is made incident as much as possible directly onto the reflection layer and reflected by the reflection surface in a desired direction (for example, in a direction of the optical axis).

According to the inventors' examination, the depth of the groove is set to be preferably in a range of from 1 to 50 μm, more preferably in a range of from 2 to 45 μm, further more preferably in a range of from 3 to 40 μm, still further preferably in a range of from 4 to 35 μm, most preferably in a range of from 5 to 20 μm.

The groove can be formed in any step after the formation of the laminate of group III nitride compound semiconductor layers. In order to form the reflection surface and the n pad electrode simultaneously, it is necessary to form the groove prior to the formation of the n pad electrode. In this case, the groove for the cutting line may be formed simultaneously.

In order to release a larger part of light from the side surface of the laminate (from the inner side surface of the groove), the light-emitting layer is preferably formed so as to reach the side surface of the laminate. The material itself for forming the light-emitting layer is present to the side surface of the laminate but the electric resistance of the p-type semiconductor layer on the light-emitting layer is high. It is therefore necessary to stick the light-transmissible electrode up to the end edge of the p-type semiconductor layer in order to import a sufficient current into the light-emitting layer located up to the side surface of the laminate to thereby obtain sufficient light emission up to the portion of the light-emitting layer.

In order to stick the light-transmissible electrode up to the end edge of the p-type semiconductor layer, it is preferable from a point of view of durability that the light-transmissible electrode is made of an alloy containing cobalt and gold as aforementioned. The light-transmissible electrode containing cobalt and gold is superior in water resistance. Hence, under an ordinary environment in use, good durability can be ensured even in the case where there is no protective film of $SiO_x$, or the like, or even in the case where the function of the protective film is insufficient.

The surface of the groove obtained by means of mechanically cutting the laminate of group III nitride compound semiconductor layers is so rough that the surface cannot reflect light sufficiently without any change applied to the surface. Therefore, the outer side surface of the groove is preferably planished like a mirror surface. According to an aspect of the present invention, a metal layer is formed on the outer side surface so as to be provided as a mirror surface. The material of the metal layer and the method of forming the metal layer are not specifically limited. However, from a point of view of reduction in the number of production steps, it is preferable that the metal layer is made of a material which is the same as that of the n pad electrode. This is because the n pad electrode and the metal layer can be formed in one and the same vapor deposition step by use of one mask.

It is preferable that the metal layer is formed on the whole region of the outer side surface of the groove.

Alternatively, the metal layer may be partially formed on the outer side surface so as to be provided as a mirror surface.

As aforementioned, the reflection surface according to the present invention can reflect a larger part of transverse light in comparison with the reflection surface of the circumferential wall of the cup portion. Hence, the lens type LED in which the light-emitting device according to the present invention is mounted can increase luminous intensity with the same amount of input electric power, in comparison with the background-art system.

As aforementioned, if the light-emitting device according to the present invention is used, there is some case where the reflection surface of the circumferential wall of the cup portion need not be provided. In this case, it is unnecessary to form the cup portion in the mount lead. Hence, the configuration of the mount lead can be simplified, so that the mount lead can be produced inexpensively. Accordingly, the production cost of the light-emitting system itself can be reduced.

As aforementioned, the light-emitting device according to the present invention is particularly effective in an SMD type LED (of the type in which a chip is directly mounted on a printed substrate) because the reflection layer is built in the light-emitting device.

An embodiment of the present invention will be described below.

This embodiment shows a light-emitting diode. FIG. 1 shows the configuration of group III nitride compound semiconductor layers in the light-emitting diode.

The detailed specifications of the light-emitting diode are same as aforementioned. As already described, each of the group III nitride compound semiconductor layers is formed by execution of MOCVD on a general condition, and the p-type layer 15, the light-emitting layer (active layer) 14 and the n-type layer 13 are partially removed by reactive ion etching to thereby reveal an n pad electrode-forming surface.

Then, a groove 121 and a cutting line 131 are formed on one and same condition in the laminate 18 from the front surface side of the laminate 18 by a dicing saw so as to be parallel to each other. Hence, the groove 121 and the cutting line 131 are equal in depth to each other. Incidentally, in order to prevent the groove 121 securely from cracking at the time of separation into chips, the depth of the groove 121 is preferably set to be smaller than the depth of the cutting line 131.

Further, in order to control the direction of reflection of light, the wafer may be inclined at the time of the formation of the groove 121 so that the angle of inclination of the outer side surface 123 defining the reflection surface can be controlled.

A Co (cobalt) layer (1.5 nm) and an Au (gold) layer (6 nm) which are materials of the light-transmissible electrode are successively laminated onto the whole surface of the wafer by a vapor deposition apparatus. Then, a photo resist is applied thereon uniformly and the photo resist is partially removed by an about 10 µm-wide portion (clearance region) from the n pad electrode-forming surface and its periphery and removed from the chip circumferential edge portion in which the groove 121 and the cutting line 131 will be formed, by photolithography. The light-transmissible electrode-forming material corresponding to the portion is removed by etching to thereby reveal the semiconductor layer (partially inclusive of the substrate). Then, the photo resist is removed.

Then, a Cr (chromium) layer (30 nm), an Au layer (1.5 µm) and an Al (aluminum) layer (10 nm) are successively evaporated and laminated by a lift-off method to thereby form a p pad electrode 135.

An n pad electrode 137 made of V and Al is also formed by a lift-off method. At the same time, the metal layer 125 is formed on the semiconductor layer in a range of from the outer side surface of the groove 121 to the cutting line 131. Hence, the metal layer 125 is made of the same material and into the same thickness as then pad electrode 137. The surface of the metal layer 125 formed on the outer side surface 123 in the groove 121 serves as a reflection surface.

The wafer obtained as described above is put into a heating furnace, and heating is performed under the same condition as aforementioned. Thus, the respective materials of the light-transmissible electrode 132 and the p pad electrode 135 are alloyed, so that the two electrodes are combined into a p-type electrode.

Then, the light-transmissible protective film 133 (of silicon oxide, silicon nitride, titanium oxide, aluminum oxide, etc.) is also formed. A sputtering method or a CVD method may be used as the method of forming the protective film.

Then, the wafer is cut into chips by an ordinary method. Alternatively, the cutting line 131 may be formed in this step.

Figure 7:
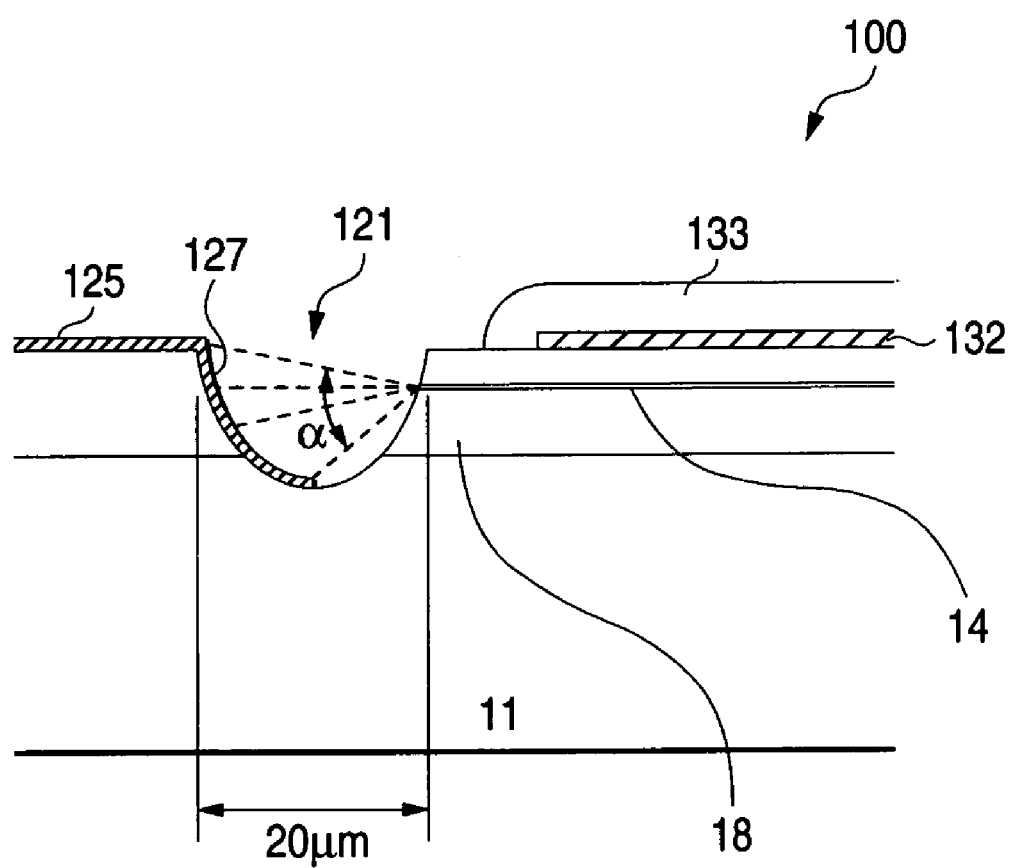
FIG. 7 shows the relation between the semiconductor laminate portion and the reflection surface in the light-emitting device according to the embodiment of the present invention.

In the light-emitting device 100 configured thus according to the embodiment, the side surface of the laminate 18 and the reflection surface are defined by the groove 121 as shown in FIG. 7. Hence, a light component within an angle α among the light transversely released from the multiple layer 14 can be grasped by the reflection surface 127 and reflected in a desired direction.

On the contrary, such a reflection surface is not provided in the background-art light-emitting device 50 in FIG. 4B as described above. Hence, in the background art, the light component reflected by the circumferential wall 55 of the cup portion among the transversely released light is a light component within a very small angle β (<<α).

The present invention is not limited to the embodiments and the description thereof at all. If various changes which can be easily conceived by those skilled in the art are not departed from the description of the scope of claim, they may be contained in the present invention.

The following paragraphs are disclosed.

11. A reflection surface provided in a group III nitride compound semiconductor light-emitting device, wherein: the reflection surface is provided in one and the same chip in which a semiconductor laminate portion including a light-emitting layer is also provided; and the reflection surface is disposed opposite to a side surface of the semiconductor laminate portion formed by etching.

12. A reflection surface according to the paragraph 11, wherein the reflection surface reflects light from the side surface of the semiconductor laminate portion into a direction of an optical axis of the light-emitting device.

13. A reflection surface according to the paragraph 11 or 12, wherein a distance between the reflection surface and the side surface of the semiconductor laminate portion is in a range of from 0.1 to 10 μm.

14. A reflection surface according to anyone of the paragraphs 11 through 13, wherein the reflection surface is made of a material which is the same as that of an n pad electrode.

15. A reflection surface according to the paragraph 14, wherein a portion of the n pad electrode opposite to the side surface of the semiconductor laminate portion forms a second reflection surface.

16. A reflection surface according to the paragraph 14 or 15, wherein: the reflection surface is formed on an n-type semiconductor layer which is formed by etching to be a first depth; and the n pad electrode is formed on the n-type semiconductor layer which is formed by etching to be a second depth shallower than the first depth.

17. A reflection surface according to anyone of the paragraphs 14 through 16, wherein the reflection surface is formed integrally with the n pad electrode.

21. A group III nitride compound semiconductor light-emitting device comprising an n pad electrode including, as a reflection surface, a portion opposite to an etched side surface of a semiconductor laminate portion containing a light-emitting layer, wherein light emitted from the side surface of the semiconductor laminate portion is reflected by the reflection surface in a direction of an optical axis of the light-emitting device.

22. An n pad electrode in a group III nitride compound semiconductor light-emitting device, the n pad electrode including, as a reflection surface, a portion opposite to an etched side surface of a semiconductor laminate portion containing a light-emitting layer, wherein light emitted from the side surface of the semiconductor laminate portion is reflected by the reflection surface in a direction of an optical axis of the light-emitting device.

31. A group III nitride compound semiconductor light-emitting device comprising:

a semiconductor laminate portion including a light-emitting layer; and a reflection surface disposed opposite to an elevation surface of the semiconductor laminate portion, wherein the semiconductor laminate portion and the reflection surface are provided in one and the same chip.

32. A group III nitride compound semiconductor light-emitting device according to the paragraph 31, wherein the reflection surface reflects light from the side surface of the semiconductor laminate portion into a direction of an optical axis of the light-emitting device.

33. A group III nitride compound semiconductor light-emitting device according to the paragraph 31 or 32, wherein a distance between the reflection surface and the side surface of the semiconductor laminate portion is in a range of from 0.1 to 10 μm.

34. A group III nitride compound semiconductor light-emitting device according to any one of the paragraphs 31 through 33, wherein the reflection surface is made of a material which is the same as that of an n pad electrode.

35. A group III nitride compound semiconductor light-emitting device according to the paragraph 34, wherein a portion of the n pad electrode opposite to the side surface of the semiconductor laminate portion forms a second reflection surface.

36. A group III nitride compound semiconductor light-emitting device according to the paragraph 34 or 35, wherein: the reflection surface is formed on an n-type semiconductor layer which is formed by etching to be a first depth; and the n pad electrode is formed on the n-type semiconductor layer which is formed by etching to be a second depth shallower than the first depth.

37. A group III nitride compound semiconductor light-emitting device according to any one of the paragraphs 34 through 36, wherein the reflection surface is formed integrally with the n pad electrode.

41. A method of producing a group III nitride compound semiconductor light-emitting device, comprising the steps of:

laminating an n-type semiconductor layer, a light-emitting layer and a p-type semiconductor layer onto a substrate to thereby form a laminate;

etching the laminate to thereby reveal the n-type semiconductor layer serving as a reflection-member-forming surface; and forming a reflection member on the reflection-member-forming surface so that the reflection member has, as a reflection surface, a surface opposite to an etched side surface of the laminate.

42. A method of producing a group III nitride compound semiconductor light-emitting device according to the paragraph 41, wherein an n pad electrode-forming surface is additionally formed by the etching step.

43. A method of producing a group III nitride compound semiconductor light-emitting device according to the paragraph 42, wherein the reflection member and the n pad electrode are formed of one material simultaneously.

44. A method of producing a group III nitride compound semiconductor light-emitting device according to any one of the paragraphs 41 to 43, wherein the reflection member is deposited by rotating a wafer while inclining the wafer with respect to a material source.

51. A group III nitride compound semiconductor light-emitting device wherein an n pad electrode and an n-type auxiliary electrode separated from the n pad electrode are provided in an n-type semiconductor layer.

52. A group III nitride compound semiconductor light-emitting device according to the paragraph 51, wherein the n-type auxiliary electrode is disposed so as to surround a semiconductor laminate portion containing a light-emitting layer.

53. A group III nitride compound semiconductor light-emitting device according to the paragraph 51 or 52, wherein the n-type auxiliary electrode is separated by corner portions of the semiconductor laminate portion.

Although the above description has been made about the group III nitride compound semiconductor light-emitting device by way of example, the material of the semiconductor is not limited to the group III nitride compound from a point of view of effectively utilizing light emitted from the side surface of the light-emitting device chip.

Hence, the following paragraphs are disclosed.

61. A semiconductor light-emitting device comprising:
a semiconductor laminate portion including a light-emitting layer; and
a reflection surface disposed so as to be opposite to a side surface of the semiconductor laminate portion formed by etching, wherein the semiconductor laminate portion and the reflection surface are provided in one and the same chip.

62. A semiconductor light-emitting device according to the paragraph 61, wherein the reflection surface reflects light from the side surface of the semiconductor laminate portion into a direction of an optical axis of the light-emitting device.

63. A semiconductor light-emitting device according to the paragraph 61 or 62, wherein a distance between the reflection surface and the side surface of the semiconductor laminate portion is in a range of from 0.1 to 10 µm.

64. A semiconductor light-emitting device according to any one of the paragraphs 61 through 63, wherein the reflection surface is made of a material which is the same as that of an n pad electrode.

65. A semiconductor light-emitting device according to the paragraph 64, wherein a portion of the n pad electrode opposite to the side surface of the semiconductor laminate portion forms a second reflection surface.

66. A semiconductor light-emitting device according to the paragraph 64 or 65, wherein: the reflection surface is formed on an n-type semiconductor layer which is formed by etching to be a first depth; and the n pad electrode is formed on the n-type semiconductor layer which is formed by etching to be a second depth shallower than the first depth.

67. A semiconductor light-emitting device according to any one of the paragraphs 64 through 66, wherein the reflection surface is formed integrally with the n pad electrode.

The following paragraphs are further disclosed.

111. A reflection surface provided in a group III nitride compound semiconductor light-emitting device, wherein the reflection surface is formed on an outer side surface of a groove mechanically formed in a laminate inclusive of a light-emitting layer.

112. A reflection surface according to the paragraph 111, wherein the groove is formed by a dicing saw.

113. A reflection surface according to the paragraph 111 or 112, wherein the reflection surface is made of a metal layer.

114. A reflection surface according to the paragraph 113, wherein the metal layer is made of a material which is the same as that of an n pad electrode, and the metal layer is formed at the same time when the n pad electrode is formed.

115. A reflection surface according to anyone of the paragraphs 111 through 114, wherein light emitted from a side surface of the laminate is reflected by the reflected surface in a direction of an optical axis of the light-emitting device.

116. A reflection surface according to anyone of the paragraphs 111 through 115, wherein the groove has a depth to reach a substrate.

117. A reflection surface according to anyone of the paragraphs 111 through 116, wherein the groove is substantially parallel to a chip cutting line.

121. A method of producing a group III nitride compound semiconductor light-emitting device, comprising the steps of:
forming a laminate of an n-type semiconductor layer, a light-emitting layer and a p-type semiconductor layer onto a substrate;
mechanically cutting the laminate to thereby form a groove; and forming a reflection surface on an outer side surface of the groove.

122. A method of producing a group III nitride compound semiconductor light-emitting device according to the paragraph 121, wherein the groove is formed by a dicing saw in the groove-forming step.

123. A method of producing a group III nitride compound semiconductor light-emitting device according to the paragraph 121 or 122, wherein a metal is deposited on the outer side surface of the groove to form a metal layer in the reflection-surface-forming step.

124. A method of producing a group III nitride compound semiconductor light-emitting device according to the paragraph 123, wherein: the metal layer is made of the same material as that of an n pad electrode; and the metal layer is formed by vapor deposition in one and the same step in which the n pad electrode is formed.

125. A method of producing a group III nitride compound semiconductor light-emitting device according to any one of the paragraphs 121 to 124, wherein the groove is formed into a depth to reach the substrate in the groove-forming step.

126. A method of producing a group III nitride compound semiconductor light-emitting device according to any one of the paragraphs 121 to 125, wherein the groove is formed so as to be substantially parallel to the chip cutting line in the groove-forming step.

What is claimed is:

1. A group III nitride compound semiconductor light-emitting device, comprising:
a semiconductor laminate portion formed on a substrate and including a light-emitting layer; and
a reflection surface provided on a layer of said semiconductor laminate portion and disposed so as to be opposite to a side surface of said light-emitting layer, wherein a predetermined distance is provided between said semiconductor laminate portion and said reflection surface.

2. A group III nitride compound semiconductor light-emitting device according to claim 1, wherein said reflection surface reflects light emitted from said side surface of said semiconductor laminate portion into a direction of an optical axis of said light-emitting device.

3. A group III nitride compound semiconductor light-emitting device according to claim 1, wherein said predetermined distance comprises a distance between said reflection surface and said side surface of said semiconductor laminate portion which is in a range of from 0.1, to 10 μm.

4. A group III nitride compound semiconductor light-emitting device according to claim 1, further comprising:
   an n pad electrode,
   wherein said reflection surface comprises a material which is the same as that of said n pad electrode.

5. A group III nitride compound semiconductor light-emitting device according to claim 4, further comprising:
   a second reflection surface comprising a portion of said n pad electrode opposite to said side surface of said semiconductor laminate portion.

6. A group III nitride compound semiconductor light-emitting device according to claim 4, wherein said reflection surface is formed on an n-type semiconductor layer which is formed by etching to a first depth, and said n pad electrode is formed on said n-type semiconductor layer which is formed by etching to a second depth shallower than said first depth.

7. A group II nitride compound semiconductor light-emitting device according to claim 4, wherein said reflection surface is formed integrally with said n pad electrode.

8. A group III nitride compound semiconductor light-emitting device according to claim 1, wherein said predetermined distance comprises a distance between said reflection surface and said side surface of said semiconductor laminate portion which is in a range of 0.2 μm to 7 μm.

9. A group III nitride compound semiconductor light-emitting device according to claim 1, wherein said predetermined distance comprises a distance between said reflection surface and said side surface of said semiconductor laminate portion which is in a range of 0.3 μm to 5 μm.

10. A group III nitride compound semiconductor light-emitting device according to claim 1, wherein an upper surface of said reflection surface is elevated higher than said light-emitting layer.

11. A group III nitride compound semiconductor light-emitting device according to claim 1, wherein said reflection surface comprises a curved reflection surface.

12. A group III nitride compound semiconductor light-emitting device according to claim 1, wherein said reflection surface reflects light emitted from said side surface of said semiconductor laminate portion.

13. A group III nitride compound semiconductor light-emitting device according to claim 1, wherein said reflection surface comprises a shape for reflecting light in a direction of an optical axis for said light-emitting device.

14. A group III nitride compound semiconductor light-emitting device according to claim 1, wherein said predetermined distance comprises a distance between said reflection surface and said side surface of said semiconductor laminate portion which is no greater than 10 μm.

15. A group III nitride compound semiconductor light-emitting device according to claim 1, wherein said direction of an optical axis comprises a direction of a center axis of said device.

16. A group III nitride compound semiconductor light-emitting device according to claim 1, further comprising:
   an n-pad electrode formed on said semiconductor laminate portion, said reflection surface comprising a side surface of said n-pad electrode having a shape for reflecting light in a direction of an optical axis for said light-emitting device.

17. A group III nitride compound semiconductor light-emitting device according to claim 1, wherein said reflection surface is formed around a circumference of said light-emitting layer.

18. A group III nitride compound semiconductor light-emitting device according to claim 1, wherein at least a portion of said reflection surface is formed near a plane of said light-emitting layer.

19. A group III nitride compound semiconductor light-emitting device according to claim 1, wherein said reflection surface is disposed so as to be transversely opposite to a side surface of said light-emitting layer.

20. A group III nitride compound semiconductor light-emitting device according to claim 1, wherein said reflection surface comprises a thickness of at least 0.7 μm.

21. A group III nitride compound semiconductor light-emitting device according to claim 1, further comprising:
   a reflective material formed on said substrate and comprising said reflection surface.

22. A group III nitride compound semiconductor light-emitting device according to claim 21, wherein said reflective material comprises an electrically conductive material.

23. A group III nitride compound semiconductor light-emitting device according to claim 21, wherein said semiconductor laminate portion comprises an n-type semiconductor layer, said reflective material being formed on a same layer as said n-type semiconductor layer.

24. A group III nitride compound semiconductor light-emitting device according to claim 1, wherein said side surface comprises a vertical side surface.

* * * * *